(12) United States Patent
Markey

(10) Patent No.: US 8,233,643 B1
(45) Date of Patent: Jul. 31, 2012

(54) SYSTEM AND METHOD FOR AMPLIFYING LOW LEVEL SIGNALS PROVIDED ON ELECTRICAL SUPPLY POWER

(75) Inventor: Brian Markey, Myersville, MD (US)

(73) Assignee: Fiberplex Technologies, LLC, Elkridge, MD (US)

( * ) Notice: Subject to any disclaimer, the term of this patent is extended or adjusted under 35 U.S.C. 154(b) by 253 days.

(21) Appl. No.: 12/730,095

(22) Filed: Mar. 23, 2010

(51) Int. Cl.
- H04R 3/00 (2006.01)
- H03F 99/00 (2009.01)
- H03F 3/04 (2006.01)

(52) U.S. Cl. .................... 381/122; 381/120; 330/297
(58) Field of Classification Search .............. 381/122, 381/111, 113, 120, 77, 79; 330/297
See application file for complete search history.

(56) References Cited

U.S. PATENT DOCUMENTS

| | | | |
|---|---|---|---|
| 4,638,258 A | 1/1987 | Crooks | |
| 5,568,561 A | 10/1996 | Whitlock | |
| 6,020,788 A | 2/2000 | Comeau | |
| 6,160,450 A | 12/2000 | Eschauzier et al. | |
| 6,408,008 B1* | 6/2002 | Komarek et al. | 370/458 |
| 6,577,187 B1 | 6/2003 | Lesko | |
| 7,072,478 B2* | 7/2006 | Hohendahl | 381/120 |
| 7,259,627 B1 | 8/2007 | Dhanasekaran et al. | |
| 7,620,189 B2* | 11/2009 | Lang et al. | 381/113 |
| 7,756,279 B2* | 7/2010 | Deruginsky et al. | 381/95 |
| 7,864,970 B2* | 1/2011 | Niwa et al. | 381/113 |
| 7,899,196 B2* | 3/2011 | Furst et al. | 381/111 |
| 7,978,863 B2* | 7/2011 | Kuiri | 381/111 |
| 8,027,489 B1* | 9/2011 | Bacha et al. | 381/113 |
| 8,036,401 B2* | 10/2011 | Poulsen et al. | 381/113 |
| 8,059,837 B2* | 11/2011 | Wu | 381/113 |
| 8,064,622 B1* | 11/2011 | Opris | 381/120 |
| 2005/0151589 A1 | 7/2005 | Fallesen | |
| 2006/0008097 A1 | 1/2006 | Stenberg et al. | |
| 2006/0147060 A1 | 7/2006 | Shyu et al. | |
| 2007/0076904 A1 | 4/2007 | Deruginsky et al. | |
| 2007/0237345 A1 | 10/2007 | Zhang et al. | |
| 2008/0002841 A1 | 1/2008 | Baker et al. | |
| 2008/0025531 A1 | 1/2008 | Suzuki et al. | |
| 2008/0075306 A1 | 3/2008 | Poulsen et al. | |
| 2008/0197831 A1* | 8/2008 | Kokubun et al. | 323/318 |

\* cited by examiner

*Primary Examiner* — Hai Phan
(74) *Attorney, Agent, or Firm* — Rosenberg, Klein & Lee

(57) ABSTRACT

A system and method for amplifying an information carrying signal provided on electrical supply power are provided. An input amplifier unit receives an input signal which contains an information carrying component and a supply power component. A power conversion unit is coupled to the input amplifier unit. The input amplifier unit amplifies the information carrying component of the input signal to generate an amplified signal. The power conversion unit generates at least one complementary set of offset supply levels each referenced to a non-zero offset ground level adaptively defined responsive to the electrical supply power, such that the amplified signal is referenced about the offset ground level. In certain embodiments, an output conditioning unit is employed to generate an output signal comprising an amplified version of the information carrying component of the input signal extracted from the amplified signal.

22 Claims, 4 Drawing Sheets

SYSTEM AND METHOD FOR AMPLIFYING LOW LEVEL SIGNALS PROVIDED ON ELECTRICAL SUPPLY POWER

BACKGROUND OF THE INVENTION

The present invention is generally directed to a system and method for amplifying a low level signal provided on electrical supply power. More specifically, the present invention is directed to a system and method for pre-amplifying an information carrying low level signal that is superimposed on electrical supply power concurrently used for energizing active components in connection with the given system. The subject system and method provide for effective amplification of the low level signal, without the undue adverse effects normally incurred in isolating the low level signal from the electrical supply power.

In certain electronic applications, a signal of interest is carried in a composite signal that also includes a power supply component. The information carrying component includes the parametric variations over time not present in the power supply component, which reflects the information being carried. In audio electronic applications, for instance, microphones having active components are often powered through the same conductive wires through which their transduced sound signals are passed. Condenser microphones whose internal components are powered via a 'phantom power' supply in this manner, as is often referred to in the art. The phantom power supply is a DC voltage, typically on the order of 48 volts or the like, carried on the microphone signal lines, with the time-varying audio signal itself superimposed thereon. Compared to the phantom power, the transduced audio signals tend to be relatively low in magnitude, typically on the order of several volts peak-to-peak or less.

Further downstream audio processing of the transduced audio signal requires its amplification up beyond these low levels. Because these signals are superimposed on the more significant phantom power levels, the composite received signal cannot simply be amplified and safely used downstream. The resulting voltage levels would be high enough to damage circuit components in many applications. Consequently, the conventional approach has been to separate the audio signal component of the composite signal from the phantom power component prior to any amplification or subsequent audio processing.

Several approaches have been taken in the industry for separating the information containing signal from phantom power. One often used approach is the inclusion of an AC coupling capacitor in each differential signal line, so that the non-varying component in an incoming signal on the line is filtered out, and passage of the DC phantom voltage component thereby blocked. Among the significant drawbacks of this approach are that it limits signal bandwidth and tends to introduce signal distortion.

Another often used approach is the use of transformer coupling to separate the information carrying signal from phantom power. While it is possible to preserve high signal fidelity with this approach, a sufficiently large coupling transformer is required. The prohibitively high costs of such transformers typically require design tradeoffs which accede to the limited bandwidth and unwanted signal distortion of less-than-optimal transformer coupling.

There is therefore a need for an approach for safely and effectively amplifying a low level signal component which is superimposed on electrical supply power component in an incoming signal. There is a need to so amplify such signal component to useful levels and to do so with minimal reduction in signal bandwidth and minimal signal distortion.

SUMMARY OF THE INVENTION

It is an object of the present invention to provide an amplifier for an information carrying signal provided on electrical supply power, which amplifies the signal to desired levels with minimal reduction in signal bandwidth and minimal signal distortion.

It is another object of the present invention to provide an amplifier for a low level signal superimposed on electrical supply power which safely amplifies just the low level signal while preserving high signal fidelity.

It is yet another object of the present invention to provide an amplifier for a low level signal superimposed on electrical supply power whose implementation is simple and highly cost effective.

These and other objects are attained in a system formed in accordance with the present invention for amplifying an information carrying signal provided on electrical supply power. The system generally includes an input amplifier unit receiving an input signal which contains an information carrying component and a supply power component, a power conversion unit coupled to the input amplifier unit, and an output conditioning unit coupled to the input amplifier unit and an offset ground node. The input amplifier unit amplifies the information carrying component of the input signal to generate an amplified signal. The power conversion unit operates to generate at least one complementary set of offset supply levels, each of the offset supply levels being referenced to a non-zero offset ground level established at the offset ground node relative to system ground. The offset ground level is adaptively defined responsive to the electrical supply power, such that the amplified signal is referenced about the offset ground level. This amplified signal may be used directly for further processing downstream, or in certain embodiments passed to an output conditioning unit which serves to generate an output signal comprising an amplified version of the information carrying component of the input signal that is extracted from the amplified signal.

A method formed in accordance with the present invention for pre-amplifying a low level signal provided on phantom power generally includes receiving an input signal containing a low level signal component superimposed on a phantom power component, and sensing a DC level of phantom power to establishing responsive thereto an offset ground level at an offset ground node. The offset ground level is adaptively elevated relative to system ground responsive to phantom power. The method further includes power converting the offset ground level obtained from the offset ground node to generate at least one complementary set of offset supply levels, each of the offset supply levels being referenced to the offset ground level. An input amplifier unit coupled to the offset supply and offset ground levels is energized for amplifying the low level signal component of the input signal, such that the input amplifier unit generates an amplified signal referenced to the offset ground level to vary thereabout. This amplified signal may be used directly for further processing downstream; or, in certain embodiments output conditioning may be carried out on the amplified signal and the offset ground level with reference to system ground to generate an output signal, which comprises an amplified version of the low level signal component of the input signal extracted from the amplified signal.

DESCRIPTION OF THE PREFERRED EMBODIMENTS

Figure 1:
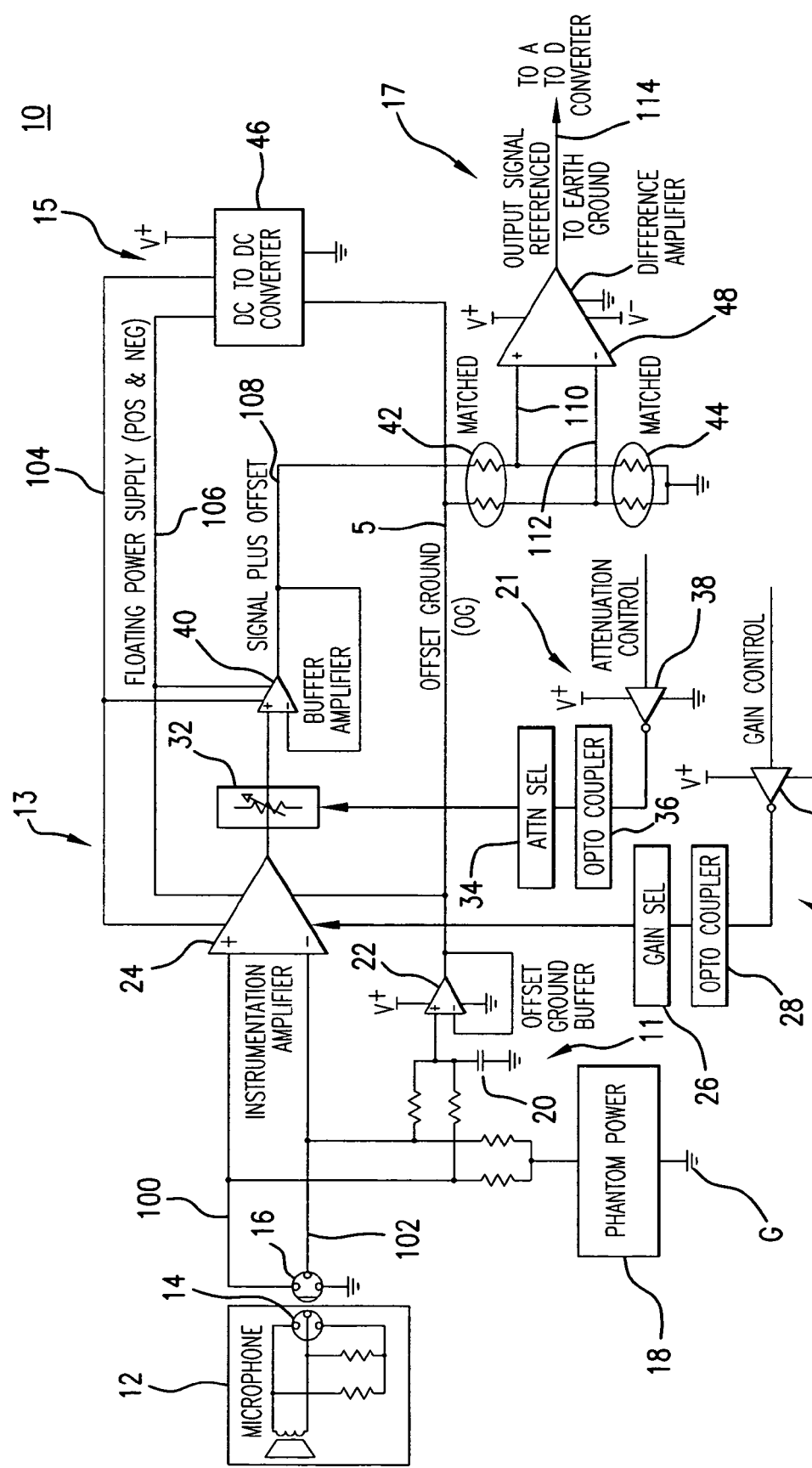
FIG. 1 is a schematic diagram illustrating a circuit formed in accordance with one exemplary embodiment of the present invention.

Referring now to FIG. 1, there is shown a schematic diagram illustrating a circuit employed in a system formed in accordance with one exemplary embodiment of the present invention. Generally, system 10 is configured in this example as a preamplifier to which a microphone 12 is suitably coupled for use via connectors 14, 16. Connectors 14, 16 may be of any suitable type known in the art, such as standard XLR connectors often used in audio industry for balanced microphone connections. Microphone 12 may be of the condenser or other suitable type whose active components may be electrically driven by supply power concurrently provided on the same signal line(s) 100, 102 on which the microphone's transduced audio signals are conducted. A phantom power supply unit 18 generates this 'phantom power' as a DC voltage of a preset value, typically though not necessarily on the order of 48 V or so.

In the example of FIG. 1, system 10 phantom power is provided on each of the differential signal lines 100, 102. A low level audio signal is transduced by the microphone 12 (to thereby contain the audio information to be further processed), which typically ranges in magnitude several volts peak-to-peak or less. As this low level audio signal is carried in differential form, complementary versions of the audio signal are superimposed on the given DC phantom power voltage component in each of the complementary lines 100, 102. A composite signal including both a time-varying signal component and a substantially constant supply power component is thus provided on each input line 100, 102.

In accordance with one aspect of the present invention, system 10 operates on each composite signal without having to first extract the information containing signal component from the power component. System 10 thus avoids the bandwidth limiting and distorting effects on the audio signal which typically plague pre-amplification systems heretofore known. System 10 enables the signal component to be safely amplified—that is, without harming electronic components or exceeding their operational ranges—before that signal component is extracted from its phantom power component for further amplification and processing.

Briefly, system 10 generates an 'offset ground' level, and references the initial amplification processes on that level. The offset ground level in the example shown is a reference voltage elevated in electric potential above the system's actual ground G. Once suitable amplification and buffering of the signal component in the composite signal has occurred, the amplified signal which results may be used directly for further processing at the elevated voltages, where given resources afford the additional power consumption this normally entails. Otherwise, the composite signal in certain embodiments is effectively decomposed for further processing by removing the offset ground level from the signal component, much as a bias voltage is generally removed from a signal of interest. The resulting signal is thereby conditioned for output, suitably referenced to system ground for further amplification and processing downstream.

System 10 includes a supply sensing unit 11 which senses the phantom power voltage and provides the offset ground level based on the sensed voltage at an offset ground node 5. Supply sensing unit 11 includes resistive elements by which a sensing capacitor 20 and an input terminal of an offset ground buffer 22 are tied to a supply voltage as set by the phantom power unit 18. Buffer 22 may be implemented by an operational amplifier or any other suitable circuit or device known in the art. The sensed voltage is accordingly buffered and applied to the offset ground node 5.

System 10 further includes an input amplifier unit 13 coupled to receive the composite signal on differential input lines 100, 102. Amplifier unit 13 is provided in the illustrated example with an instrumentation amplifier 24, attenuator 32, and buffer amplifier 40 operably coupled in sequence to effectively form programmable gain stages for the incoming signal (as described in following paragraphs). The amplifier unit 13 remains coupled and referenced to the offset ground node 5 during its operation.

While the attenuator 32 may be formed in any suitable manner known in the art, it is formed in the illustrated embodiment with a digitally controlled resistance provided in the feedback of an operational amplifier. Its programmable attenuation is actually realized in terms of a programmable gain.

A power conversion unit 15 is coupled to provide based on the offset ground level sufficient offset supply levels for safely energizing the amplifier unit 13. Preferably, power conversion unit 15 includes an isolated DC-DC converter 46 operable to effect DC-to-DC conversion of the offset ground level to generate floating power supply levels referenced to offset ground OG. In the example shown, power conversion unit 15 provides at least one complementary set of offset supply levels at lines 104, 106. For instance, a positive offset supply level of OG+20V and a negative offset supply level of OG−20V may be provided on lines 104, 106. This set of offset supply levels preferably power the active components of the amplifier unit 13, such as shown for the instrumentation amplifier 24 and buffer amplifier 40. While the absolute voltage levels at which the amplifier unit's active circuits/components operate may well exceed their acceptable voltage limits, therefore, the potential differences seen across those circuits/components do not. The elevated offset ground level OG to which the voltage potential is referenced during operation guards against such breach of operational limits.

Depending on the requirements of the intended application, and the loads encountered during operation, the phantom power level—hence, the offset ground level OG—may not remain at a fixed, consistent level. Excessive current draw, for example, will have considerable effect on the actual phantom power voltage level. The offset supply levels provided by power conversion unit 15 move accordingly with the phantom power voltage in that case.

In accordance with one aspect of the present invention, the amplifier unit 13 is then free to amplify the complementary composite signals received without first removing the phantom power component's DC offset. The amplified signal component remains superimposed on the DC offset (or offset ground level OG) in the amplified signal output of the amplifier unit 13 at line 108. Consequently, its absolute DC voltage level at that point will tend to be excessive for downstream processing stages. Readily available components typically used in subsequent stages would not withstand the peaks of the combined amplified audio signal and phantom power component voltages.

For example, without the use of an offset ground level in accordance with the present invention, the peak voltages with an amplified 15V AC signal component superimposed on 48V phantom power could reach a 63V maximum and a −15V minimum. Low noise components capable of safely operating at such excessive levels are not readily available or otherwise prohibitively expensive for many applications. The offset ground level approach employed in accordance with the present inventions enables the use commonly available components to provide the necessary signal gain, without overstressing them.

An output conditioning unit 17 is preferably provided in system 10 coupled to the output of amplifier unit 13 and the offset ground node 5 for providing the necessary attenuation to make productive further use of the amplified signal. Output conditioning unit 17 in this embodiment includes a difference amplifier 48 and matched resistive networks 42, 44 which couple its positive and negative input lines 110, 112 respectively to the amplifier unit output line 108 and system ground G on the one hand, and to the offset ground node 5 and system ground G on the other. The resistive networks 42, 44 are matched in the sense that, in the simplest case, they define substantially identical voltage divider networks from the line 108 and offset ground node 5 to the complementary input lines 110, 112 of the difference amplifier 48. This preserves the time varying difference between the two voltage levels present at line 108 and node 5. Again, in other embodiments where the resources and requirements of a particular application permit, the amplified signal resulting from the input amplifier unit 13 may be used directly for further processing at the elevated voltages.

The actual resistance values in the resistive networks 42, 44 are suitably set so that the DC voltage levels from line 108 and the offset ground node 5 are attenuated by the same amount to remove a substantial portion of the offset ground voltage from both. If, for example, network 44 established matched resistances of 560 ohms, and network 42 established matched resistances of triple that value, or 560×3=1680 ohms, the residual input at the positive input line 110 into difference amplifier 48 would be approximately ¼ of the amplified signal output by the amplifier unit 13. Conversely, the residual input at the negative input line 112 into difference amplifier 48 would be approximately ¼ of the offset ground level. The voltages at both input lines 110, 112 would be referenced to system ground G.

As difference amplifier 48 amplifies takes the difference between the signal input lines, it effectively sees only the 'AC' or time varying audio signal component of the amplified signal as output by unit 13. This time varying signal component is amplified (or attenuated) further depending on the gain preselected for difference amplifier 48, so that an output signal referenced to system ground is provided at line 114 for further downstream processing.

In this manner, the composite input signal from the microphone 12 and phantom power unit 18 is pre-amplified at an elevated potential about the offset ground level. The voltage levels in the resulting signal are sufficiently high during this process, such that the signal may be subsequently attenuated down below the noise floor of difference amplifier 48, if necessary, while preserving sufficiently high signal to noise ratio in the audio signal component of interest. Otherwise, extraneous measures would be necessary to suppress the noise imposed by the amplifying circuits on the low level audio signal. System 10 enables the given processing of signal at levels well above the noise floor of the processing circuit to avoid degradation in signal quality.

Difference amplifier 48 is preferably suited in typical applications to operate at plus or minus 15V supply and accommodate up to 10V DC offset voltage at input line 112. This provides sufficient operating range for an AC signal component varying between 0V and 5V, about a 2.5V level.

System 10 preferably also includes a gain control unit 19 and an attenuation control unit 21 coupled respectively to the instrumentation amplifier 24 and attenuator 32 of the amplifier unit 13. Control units 19, 21 enable the collective gain of the instrumentation amplifier 24, attenuator 32, and buffer amplifier 40 to be programmably controlled (responsive to corresponding digital GAIN CONTROL and ATTENUATION CONTROL signals, as indicated). Each of the control units 19, 21 in the illustrated embodiment includes an inverter 30, 38 which receives the corresponding control signal for passage to an opto-coupler 28, 36 that provides an isolation barrier for operable transfer of the received digital information across the given offset between system ground G and offset ground OG. The digital information is transferred by the opto-coupler 28, 36 through to the corresponding gain/attenuation select device 26, 34 which responsively sets the gain/attenuation of the instrumentation amplifier 24 or attenuator 32. In certain alternate embodiments, the two separate gain control units 19, 21 may be combined into one unit suitably coupled to appropriate portions of the amplifier unit 13.

Turning to the gain and attenuation select devices 26, 34, each may be implemented in any suitable manner known in the art. In one example, gain select device 26 is preferably formed with a set of analog switches having resistors disposed across gain control pins provided on the instrumentation amplifier 24. The settings are set responsive to the received digital control signal to selectively apply the desired gain level. Attenuation select device 32 is similarly formed to latch the desired attenuation level responsive to a received digital data stream.

System 10 may be implemented using any suitable circuitry, devices, electrical components, or the like known in the art. One skilled in the art will recognize that the circuit elements schematically represented or otherwise indicated in connection with FIG. 1 may be implemented in various ways. The circuit elements may comprise discrete components, or—as in the case of the operational amplifier devices variously configured to serve different operational purposes—will themselves include circuitry integrated therein for such purposes. The present invention is not limited to any particular manner of implementation for the disclosed system and method.

Figure 2:
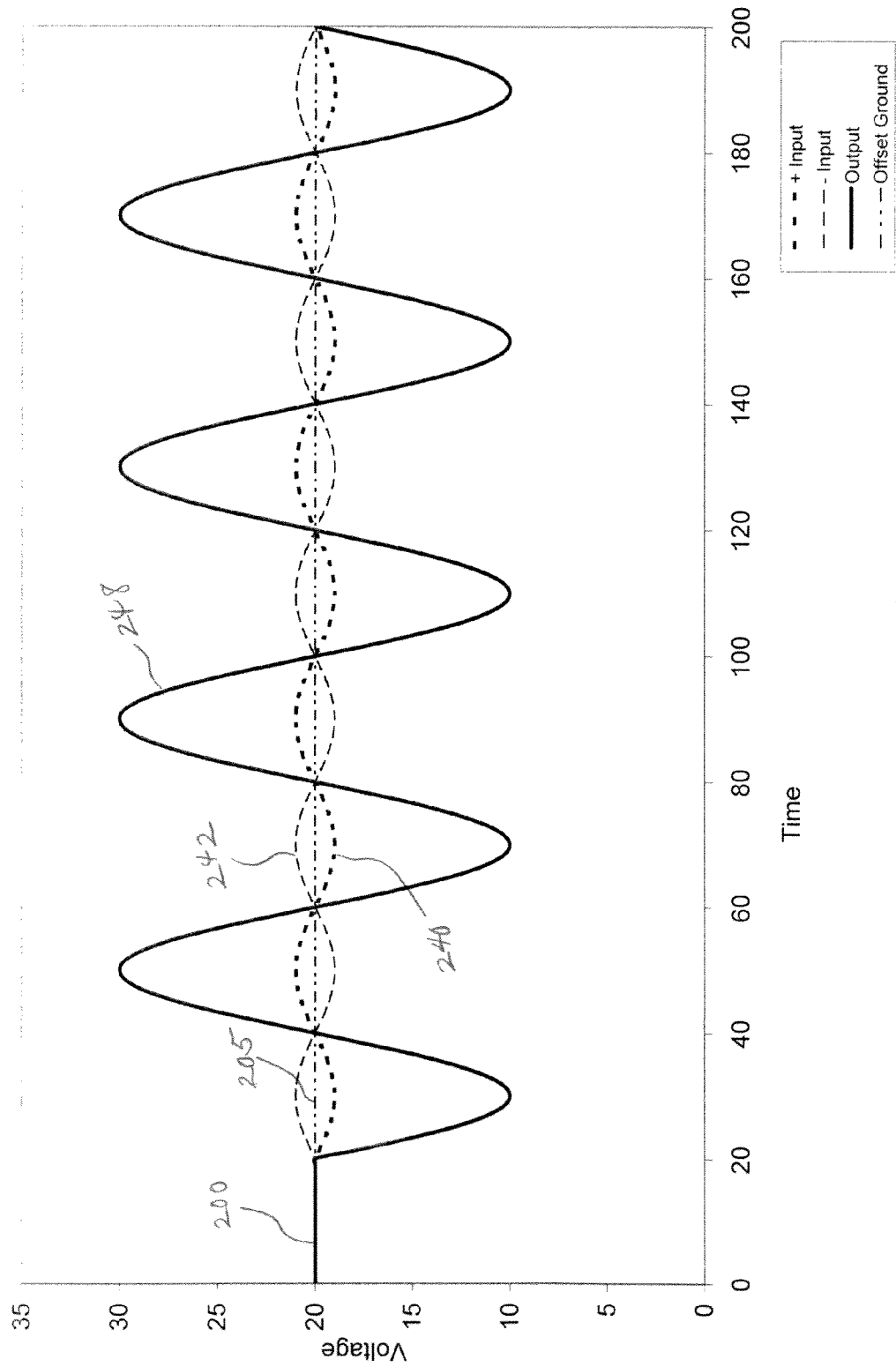
FIG. 2 is a schematic diagram showing illustrative voltage waveforms at a first portion of the circuit illustrated in FIG. 1 during operation under ideal conditions in one example.
Figure 3:
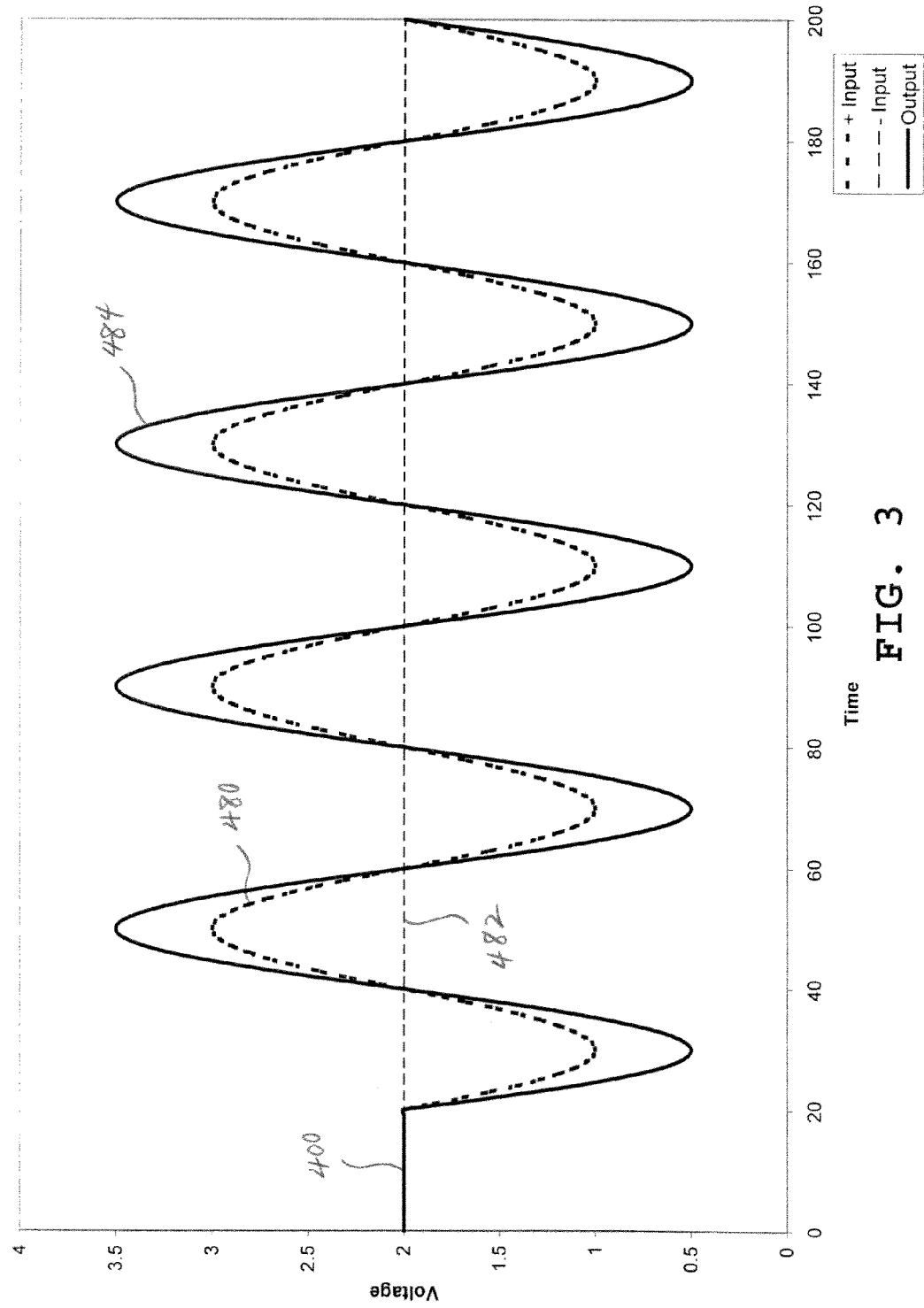
FIG. 3 is a schematic diagram showing illustrative voltage waveforms at a second portion of the circuit illustrated in FIG. 1 during operation under ideal conditions in the example of FIG. 2; and, FIG. 4 is a block diagram illustrating a flow of processes in a method implemented in accordance with one exemplary embodiment of the present invention.

Turning now to FIGS. 2-3, there are shown waveforms illustrating in one example the voltage levels occurring under a certain set of operating conditions at different portions of system 10 schematically illustrated in FIG. 1. For explanatory purposes, the waveforms are represented under ideal conditions, without noise, interference, loss, switching transients, or other electrical effects normally encountered to differing degrees under actual operating conditions.

FIG. 2 illustrates voltage waveforms at the input and output terminals of the input amplifier unit's instrumentation amplifier 24, and at the offset ground node 5, during system operation. In the example shown, a phantom power level of 20V is used. The microphone 12 is connected to system 10 and phantom power unit 18 (which may or may not be integrated with system 10) via the mated connectors 14, 16, but does not output any transduced audio signals before time T1=20, though it is energized by phantom power for operation during that time. All the waveforms before T1 therefore remain substantially at 20V, as indicated by the waveform portion 200. At T1, microphone 12 begins to put out a low level audio signal component (ranging approximately between +1V and V) which is superimposed on phantom power, in differential signal form. Waveform 240 illustrates the composite signal which results on line 100 tied to the positive input of the instrumentation amplifier 24. Waveform 242 illustrates the complementary composite signal which results on line 102 tied to the complementary input of the instrumentation amplifier 24. During this time, the offset ground node 5 remains at the desired OG level, which in the given example is set substantially at the phantom power level (though it need not be identical thereto). This is indicated by waveform 205.

Waveform 248 illustrates the output of the instrumentation amplifier 24 having a selectively set gain. Powered as it is by offset supply levels (from the power conversion unit 15) referenced to the offset ground level OG, the amplifier gain yields an output waveform 248 reflecting amplification about that non-zero offset ground level OG. The waveform 248 hits a correspondingly elevated absolute voltage peak of +30V which, if simply referenced to system ground G, might be excessive for the instrumentation amplifier 24 or other components/devices of the input amplifier unit 13. Since instrumentation amplifier 24 (like the other active portions of amplifier unit 13) remains referenced to offset ground OG, the maximum potential difference it sees is ±10V about the offset ground level of 20V (as waveform 248 ranges between voltage peaks at +30V and +10V).

FIG. 3 illustrates voltage waveforms at the input and output terminals of the output conditioning unit's difference amplifier 48 during system operation. Much as in FIG. 2, all the waveforms before time T1=20 remain substantially at 20V, as indicated by the waveform portion 400. At T1, Waveform 480 illustrates the amplified signal coming out of the instrumentation amplifier, after it has undergone a voltage drop due to the voltage divider defined by resistive networks 42, 44 for application on line 110 tied to the positive input of the difference amplifier 48. Waveform 482 illustrates the offset ground level OG, after it has undergone a corresponding voltage drop due to the voltage divider defined by resistive networks 42, 44 for application on line 112 tied to the complementary input of the difference amplifier 48.

In this example, the amplified signal generated by the amplifier unit 13 and the offset ground OG have each been attenuated to approximately $1/10^{th}$ its magnitude. Waveform 482 thus reflects a DC voltage of approximately 2V above system ground G (or earth ground in this case). Waveform 480 describes an AC voltage having peaks approximately at ±1V about the DC voltage 482, or at +3V and +1V.

Waveform 484 illustrates the output of the difference amplifier 48 having a predetermined gain. Waveform 484 reflects amplification of just the difference between waveforms 480, 482. In the given example, the approximate 1V difference between the AC signal at line 110 into difference amplifier 48 and the DC voltage at line 112 into difference amplifier 48 (from which the offset ground voltage has been largely removed) is amplified to generate an output signal having peaks at approximately ±1.5V about the +2V DC level of waveform 482, or at approximately +3.5V and +0.5V. This output signal 484 is thus provided at sufficiently low average voltage levels for safe further processing downstream.

Figure 4:
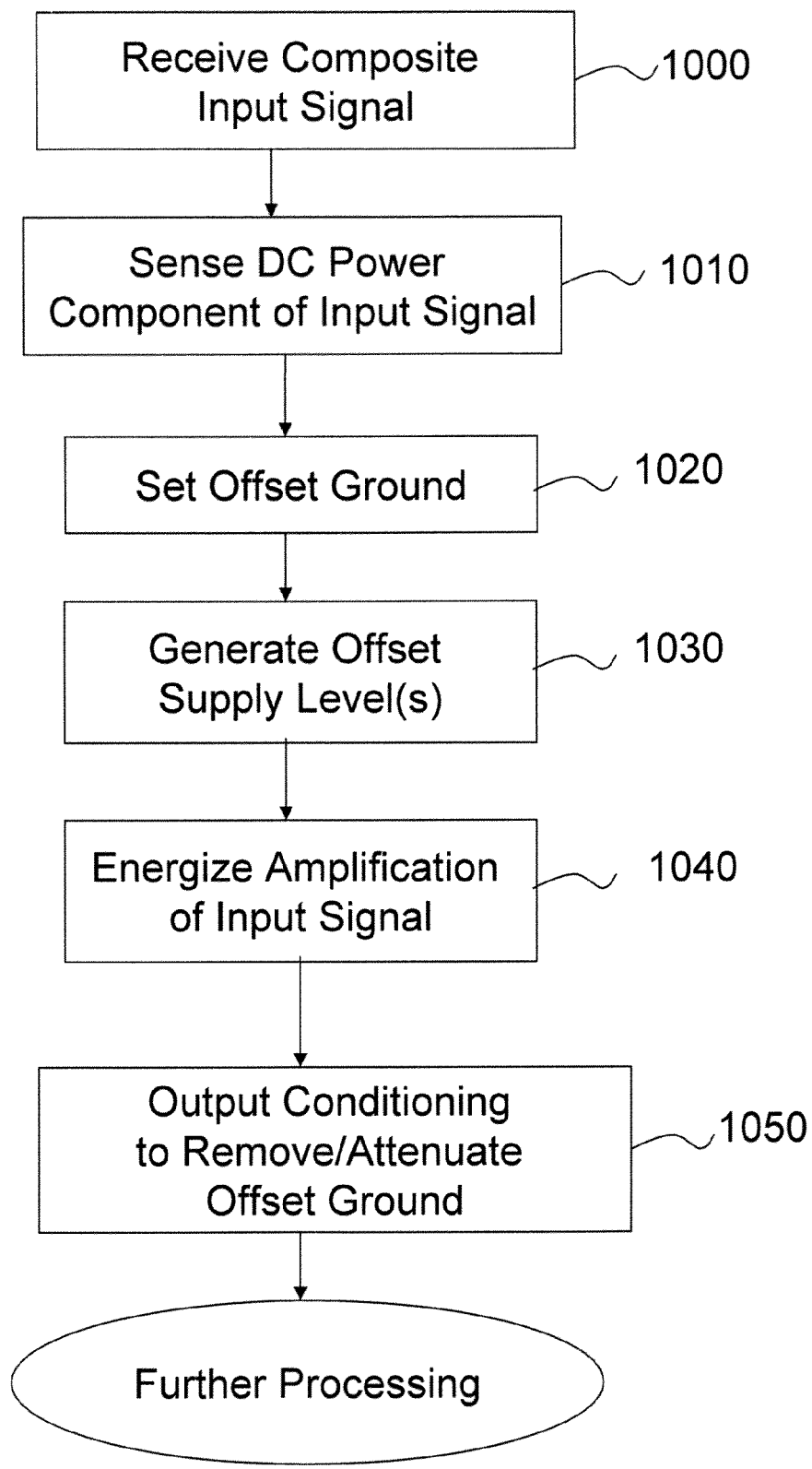

Referring now to FIG. 4, there is shown a block diagram illustrating a flow of processes in a method implemented in accordance with one exemplary embodiment of the present invention. The method generally includes receiving an input signal at block 1000 containing a low level signal component which is superimposed on a phantom power component. At block 1010, a DC level indicative of phantom power is sensed to responsively establish at block 1020 an offset ground level (at an offset ground node). The offset ground level is thereby adaptively elevated relative to system ground responsive to phantom power. At block 1030, suitable power conversion is carried out based on the offset ground level to generate at least one complementary set of offset supply levels, each of which is referenced to the offset ground level. At block 1040, an amplification unit is energized by the offset supply levels to amplify the low level signal component of the input signal and generate an amplified signal referenced to the offset ground level to vary thereabout.

The amplified signal may be used directly for further processing at the elevated voltages where the resources and requirements of a particular application permit. In the embodiment shown, output conditioning is carried out on both the amplified signal and the offset ground level at block 1050, with reference to system ground. This effectively removes or attenuates the elevated offset ground component from the amplified signal, so as to generate an output signal which comprises an amplified version of the low level signal component of the input signal. The output signal is then made available for safe use in further processing.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements or processes may be reversed or interposed, all without departing from the spirit or scope of the invention as defined in the appended claims.

What is claimed is:

1. A system for amplifying an information carrying signal provided on electrical supply power comprising:
   an input amplifier unit receiving an input signal containing an information carrying component and a supply power component, said input amplifier unit amplifying the information carrying component of the input signal to generate an amplified signal;
   a supply sensing unit coupled to said input amplifier and an offset ground node, said supply sensing unit sensing the supply power component and establishing responsive thereto a non-zero offset ground level adaptively offset in electrical potential from system ground; and
   a power conversion unit coupled to said input amplifier unit to generate therefor at least one complementary set of offset supply levels;
   wherein each of said offset supply levels is referenced in electrical potential to said non-zero offset ground level established at said offset ground node relative to system ground, said amplified signal being thereby referenced in electrical potential about said non-zero offset ground level.

2. The system as recited in claim 1, further comprising an output conditioning unit coupled to said input amplifier unit and said offset ground node, said output conditioning unit extracting an amplified version of said information carrying component of the input signal from said amplified signal and generating an output signal based thereon.

3. The system as recited in claim 1, wherein said input amplifier unit includes an instrumentation amplifier receiving the input signal, the input signal being a differential signal referenced in electrical potential to a common mode voltage defined by the electrical supply power, said instrumentation amplifier being coupled to receive said offset supply and non-zero offset ground levels, said instrumentation amplifier being thereby energized to amplify the differential portion of the input signal according to a preset gain.

4. The system as recited in claim 3, wherein said supply sensing unit senses a DC level of the electrical supply power and responsively establish said non-zero offset ground level at said offset ground node, said supply sensing unit including a sensing capacitor resistively coupled to receive the differential input signal.

5. The system as recited in claim 3, further comprising a gain control unit coupled to said instrumentation amplifier of said input amplifier unit, said gain control unit being operable to selectively adjust said preset gain of said instrumentation amplifier.

6. The system as recited in claim 2, wherein said output conditioning unit includes a difference amplifier coupled to said input amplifier unit and said offset ground node respectively by matched resistive networks, said difference amplifier being coupled to system ground for providing said output signal referenced in electrical potential to said system ground.

7. The system as recited in claim 3, wherein said input amplifier unit further includes an attenuator and a buffer amplifier coupled in sequence at an output terminal of said instrumentation amplifier, said buffer amplifier being energized by said offset supply levels to establish said amplified signal.

8. The system as recited in claim 7, further comprising an attenuation control unit coupled to said attenuator of said input amplifier unit, said attenuation control unit being operable to selectively adjust an attenuation parameter applied to an intermediate signal generated by said instrumentation amplifier.

9. The system as recited in claim 1, wherein said power conversion unit includes a DC to DC converter circuit operable to generate said offset supply levels to be offset in complementary manner from said non-zero offset ground level by a substantially equal DC voltage.

10. The system as recited in claim 1, wherein said input amplifier unit includes a connector for phantom power coupling of the instrumentation amplifier and electrical supply power to a microphone having active components.

11. A system for pre-amplifying a low level signal provided on phantom power comprising:
an input amplifier unit receiving an input signal containing a low level signal component superimposed on a phantom power component, said input amplifier unit amplifying generating, responsive to the input signal, an amplified signal including an amplified version of said low level signal component;
a supply sensing unit coupled to said input amplifier, said supply sensing unit sensing a DC level of the phantom power and responsively establish an offset ground level at an offset ground node, said offset ground level being adaptively elevated relative to system ground responsive to phantom power;
a power conversion unit coupled to said input amplifier unit and said offset ground node to generate at least one complementary set of offset supply levels, each of said offset supply levels being referenced in electrical potential to said offset ground level, said amplified signal generated by said input amplifier unit being thereby referenced in electrical potential to said offset ground level to vary thereabout; and
an output conditioning unit coupled to said input amplifier unit and said offset ground node, said output conditioning unit extracting the amplified version of said low level signal component from said amplified signal and generating an output signal based thereon.

12. The system as recited in claim 11, wherein said input amplifier unit includes an adjustable gain instrumentation amplifier receiving the input signal, the input signal being a differential signal referenced in electrical potential to a common mode voltage defined by the sensed DC level of phantom power, said adjustable gain instrumentation amplifier being coupled to receive said offset supply and offset ground levels, said adjustable gain instrumentation amplifier being thereby energized to amplify the differential portion of the input signal according to a selectively set gain.

13. The system as recited in claim 12, wherein said output conditioning unit includes a difference amplifier coupled to said input amplifier unit and said offset ground node respectively by matched resistive networks, said difference amplifier being coupled to system ground for providing said output signal referenced in electrical potential to said system ground.

14. The system as recited in claim 13, wherein said input amplifier unit further includes an attenuator and a buffer amplifier coupled in sequence at an output terminal of said adjustable gain instrumentation amplifier, said buffer amplifier being energized by said offset supply levels to establish said amplified signal.

15. The system as recited in claim 14, wherein said power conversion unit includes a DC to DC converter circuit operable to generate said offset supply levels to be offset in complementary manner from said offset ground level by a substantially equal DC voltage.

16. The system as recited in claim 15, wherein said input amplifier unit includes an XLR connector for coupling of the adjustable gain instrumentation amplifier and phantom power to a microphone having active components.

17. A method for pre-amplifying a low level signal provided on phantom power comprising the steps of:
receiving an input signal containing a low level signal component superimposed on a phantom power component;
sensing a DC level of phantom power and establishing responsive thereto an offset ground level at an offset ground node, said offset ground level being adaptively elevated relative to system ground responsive to phantom power;
power converting the offset ground level obtained from said offset ground node to generate at least one complementary set of offset supply levels, each of said offset supply levels being referenced in electrical potential to said offset ground level; and
energizing an input amplifier unit coupled to said offset supply and offset ground levels for generating, responsive to the input signal, an amplified signal including an amplified version of said low level signal component, said amplified signal being varied in electrical potential about said offset ground level.

18. The method as recited in claim 17, further comprising the step of output conditioning said amplified signal and said offset ground level with reference to system ground, said output conditioning including extracting the amplified version of said low level signal component from said amplified signal and generating an output signal based thereon.

19. The method as recited in claim 18, wherein the input signal is received in differential signal form referenced in electrical potential to a common mode voltage defined by the sensed DC level of phantom power, the differential portion of the input signal being thereby amplified according to a selectively set gain.

20. The method as recited in claim 19, wherein said output conditioning includes concurrently dropping said amplified signal and said offset ground level in potential through respective matched resistive networks, and amplifying the difference therebetween to provide said output signal referenced in electrical potential to system ground.

21. The method as recited in claim 20, wherein the input signal is passed in sequence within said input amplifier unit through an instrumentation amplifier, an attenuator, and a buffer amplifier, said buffer amplifier being energized by said offset supply levels to establish said amplified signal.

22. The method as recited in claim 21, wherein said power converting includes DC to DC conversion for generating offset supply levels to be offset in complementary manner from said offset ground level by a substantially equal DC voltage.

* * * * *